(12) United States Patent
Liniger et al.

(10) Patent No.: US 9,018,089 B2
(45) Date of Patent: Apr. 28, 2015

(54) MULTIPLE STEP ANNEAL METHOD AND SEMICONDUCTOR FORMED BY MULTIPLE STEP ANNEAL

(75) Inventors: Eric G. Liniger, Sandy Hook, CT (US); Griselda Bonilla, Fishkill, NY (US); Pak Leung, Cedar Park, TX (US); Stephen A. Cohen, Wappingers Fall, NY (US); Stephen M. Gates, Ossining, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 13/221,698

(22) Filed: Aug. 30, 2011

(65) Prior Publication Data

US 2013/0049207 A1    Feb. 28, 2013

(51) Int. Cl.
*H01L 21/26* (2006.01)
*H01L 21/3105* (2006.01)
*H01L 21/66* (2006.01)
*H01L 21/768* (2006.01)

(52) U.S. Cl.
CPC ........... *H01L 21/3105* (2013.01); *H01L 22/14* (2013.01); *H01L 21/76828* (2013.01); *H01L 21/76829* (2013.01)

(58) Field of Classification Search
USPC ......... 438/502, 509, 660, 661, 662, 663, 664, 438/530, 540, 550, 522, 795, 796, 797, 798, 438/799
See application file for complete search history.

(56) References Cited

U.S. PATENT DOCUMENTS

| | | | | |
|---|---|---|---|---|
| 3,887,740 A | * | 6/1975 | Foster et al. | 502/261 |
| 4,338,111 A | * | 7/1982 | Edahiro et al. | 65/426 |
| 4,902,325 A | * | 2/1990 | Kyoto et al. | 65/424 |
| 6,200,920 B1 | * | 3/2001 | Debras et al. | 502/103 |
| 6,346,488 B1 | * | 2/2002 | Kabansky | 438/783 |
| 6,673,433 B1 | * | 1/2004 | Saeki et al. | 428/323 |
| 6,919,101 B2 | * | 7/2005 | Zhang et al. | 427/255.29 |
| 7,088,003 B2 | * | 8/2006 | Gates et al. | 257/774 |
| 7,154,179 B2 | * | 12/2006 | Tabuchi et al. | 257/751 |
| 7,232,764 B1 | * | 6/2007 | Yaegashi | 438/702 |
| 7,410,895 B2 | * | 8/2008 | Lin et al. | 438/622 |
| 7,446,058 B2 | * | 11/2008 | Yang et al. | 438/781 |
| 7,452,804 B2 | * | 11/2008 | Beck et al. | 438/627 |

(Continued)

OTHER PUBLICATIONS

L.T. Zhuravlev, The surface chemistry of amorphous silica. Zhuravlev model, Colloids and Surfaces A: Physicochemical and Engineering Aspects 173 (2000) 1-38.*

*Primary Examiner* — Chuong A Luu
*Assistant Examiner* — Jaehwan Oh
(74) *Attorney, Agent, or Firm* — Louis J. Percello, Esq.; McGinn IP Law Group, PLLC

(57) ABSTRACT

A method of annealing a semiconductor and a semiconductor. The method of annealing including heating the semiconductor to a first temperature for a first period of time sufficient to remove physically-adsorbed water from the semiconductor and heating the semiconductor to a second temperature, the second temperature being greater than the first temperature, for a period of time sufficient to remove chemically-adsorbed water from the semiconductor. A semiconductor device including a plurality of metal conductors, and a dielectric including regions separating the plurality of metal conductors, the regions including an upper interface and a lower bulk region, the upper interface having a density greater than a density of the lower bulk region.

21 Claims, 10 Drawing Sheets

800

(56) References Cited

U.S. PATENT DOCUMENTS

| | | | |
|---|---|---|---|
| 7,750,479 B2* | 7/2010 | Purushothaman et al. | 257/774 |
| 7,790,634 B2* | 9/2010 | Munro et al. | 438/789 |
| 7,795,740 B2* | 9/2010 | Yang et al. | 257/774 |
| 7,851,339 B2* | 12/2010 | Dong et al. | 438/543 |
| 8,093,591 B2* | 1/2012 | Suzawa et al. | 257/59 |
| 2004/0066354 A1* | 4/2004 | Aoki et al. | 345/60 |
| 2004/0149686 A1* | 8/2004 | Zhang et al. | 216/37 |
| 2005/0064698 A1* | 3/2005 | Chang et al. | 438/623 |
| 2005/0084619 A1* | 4/2005 | Zhang et al. | 427/535 |
| 2005/0184397 A1* | 8/2005 | Gates et al. | 257/774 |
| 2005/0212135 A1 | 9/2005 | Wu et al. | |
| 2005/0239278 A1* | 10/2005 | Li et al. | 438/618 |
| 2005/0245100 A1* | 11/2005 | Wu et al. | 438/790 |
| 2007/0134924 A1* | 6/2007 | Yaegashi | 438/697 |
| 2008/0026597 A1* | 1/2008 | Munro et al. | 438/788 |
| 2008/0047466 A1* | 2/2008 | Tanoue et al. | 106/286.4 |
| 2010/0171198 A1* | 7/2010 | Kato et al. | 257/632 |
| 2011/0070680 A1* | 3/2011 | Takeishi et al. | 438/72 |
| 2011/0287591 A1* | 11/2011 | Yamazaki et al. | 438/158 |

* cited by examiner

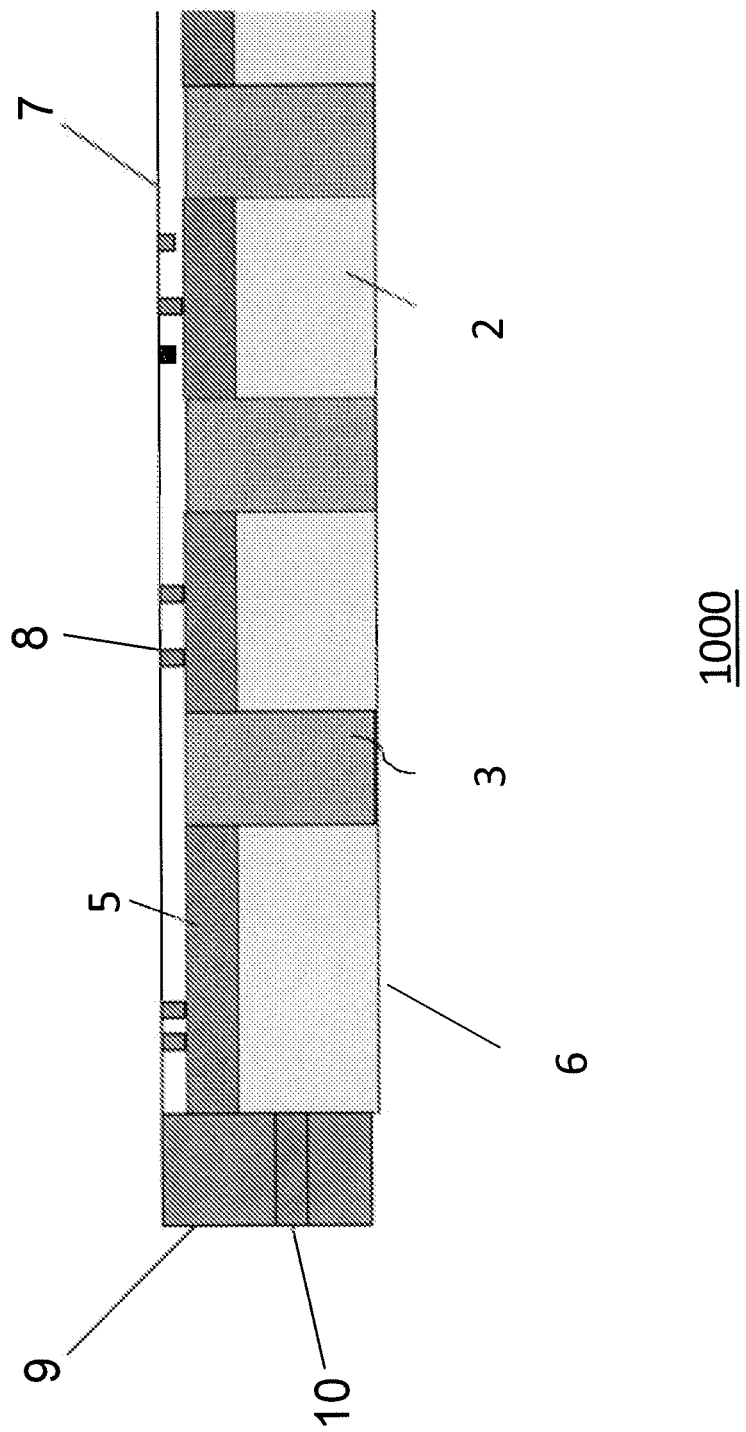

MULTIPLE STEP ANNEAL METHOD AND SEMICONDUCTOR FORMED BY MULTIPLE STEP ANNEAL

BACKGROUND OF THE INVENTION

1. Field of the Invention

The present invention generally relates to a method of annealing a semiconductor and a semiconductor formed by the method and more particularly, to a method of annealing a semiconductor by conducting a low temperature anneal and a high temperature anneal. More specifically, an exemplary embodiment of the invention includes a multiple step heating procedure which removes, first, physically-adsorbed water, followed by a second heating to remove chemically-adsorbed water. Another exemplary embodiment of the invention includes a semiconductor device which includes a dielectric including regions separating a plurality of metal conductors, the regions including an upper interface and a lower bulk region, the upper interface having a density greater than a density of the lower bulk region.

2. Description of the Related Art

Time dependent dielectric breakdown (TDDB) testing is commonly used to test semiconductor devices such as semiconductor wafers or chips to evaluate the susceptibility of the inter-level dielectric material (ILD) between neighboring metal lines to electrical breakdown.

During production a wafer may be partially built and a thin capping layer may be placed on the unfinished wafer (i.e., a wafer without a final passivation layer may be produced). The wafers can then sit in the fabrication environment or may be in transit for a time period prior to running a TDDB reliability test. During this period water may contaminate the unfinished wafer by being adsorbed both physically and chemically into the unfinished wafer. Water contamination into a semiconductor device has a detrimental effect on TDDB lifetimes.

The TDDB reliability testing performed on partially built wafers with water absorption produce results which are often orders of magnitude worse than the same wafers would have had without water absorption. Therefore, the TDDB reliability test results are not particularly indicative of the reliability of the partially built wafer.

In addition, if the integrity of a fully passivated chip is compromised, such as damage occurring to an edge seal during dicing, then water may enter the chip at an ingress point due to the damage. Similarly to the above scenario, water may then be adsorbed both physically and chemically into the chip. As a result of this water contamination, the result of the TDDB reliability test can be orders of magnitude worse than the same chip would have had without the water absorption. Thus, the TDDB reliability test of the chip will not be particularly indicative of the reliability of the fully passivated and fully sealed chip. Therefore, meaningful TDDB testing on water contaminated semiconductor devices cannot be conducted.

The ability to test partial-build structures for TDDB by removing any moisture effects would greatly reduce cost and turnaround time because no final passivation layers would have to be used in the build.

Despite many attempts over the years, there is currently no process which successfully removes water from the wafer or from individual chips in order to conduct a reliable TDDB test.

SUMMARY OF THE INVENTION

In view of the foregoing, and other, exemplary problems, drawbacks, and disadvantages of the conventional systems, it is an exemplary feature of the present invention to provide a structure and method which provides an improved accuracy of TDDB tests.

Various experiments have been conducted and the present inventors have discovered that all previous attempts to remove the water from the semiconductor devices have centered on using a single temperature anneal process and all have failed to provide adequate restoration of the chip so that meaningful TDDB test results can be obtained.

An exemplary embodiment of the method includes providing a semiconductor, heating the semiconductor to a first temperature for a first period of time sufficient to remove physically-adsorbed water from the semiconductor, and heating the semiconductor to a second temperature, the second temperature being greater than the first temperature, for a period of time sufficient to remove chemically-adsorbed water from the semiconductor.

Another exemplary embodiment of the method includes providing a semiconductor, exposing the semiconductor to an atmosphere including $N_2$ at temperature greater than 100° C. and less than 200° C. for approximately 12-48 hours, and exposing the semiconductor to an atmosphere including $N_2$ at temperature in a range of 350° C. to 400° C. for 30 to 120 minutes.

Another exemplary embodiment of the invention includes a semiconductor device, which includes a plurality of metal conductors, and a dielectric including regions separating the plurality of metal conductors. The dielectric regions include an upper interface and a lower bulk region, the upper interface having a density greater than the density of the lower bulk region.

Therefore, the multiple step anneal process may allow reliable TDDB testing of semiconductor devices which have adsorbed water.

Further, the multiple step anneal process may produce a semiconductor having a dielectric where an upper interface has a density greater than the density of the lower bulk region. This may provide enhanced reliability during TDDB testing.

BRIEF DESCRIPTION OF THE DRAWINGS

The foregoing and other purposes, aspects and advantages will be better understood from the following detailed description of a preferred embodiment of the invention with reference to the drawings, in which:

FIG. 10 shows a semiconductor with a cap layer and edge seal.

DETAILED DESCRIPTION OF EXEMPLARY EMBODIMENTS OF THE INVENTION

Figure 1:
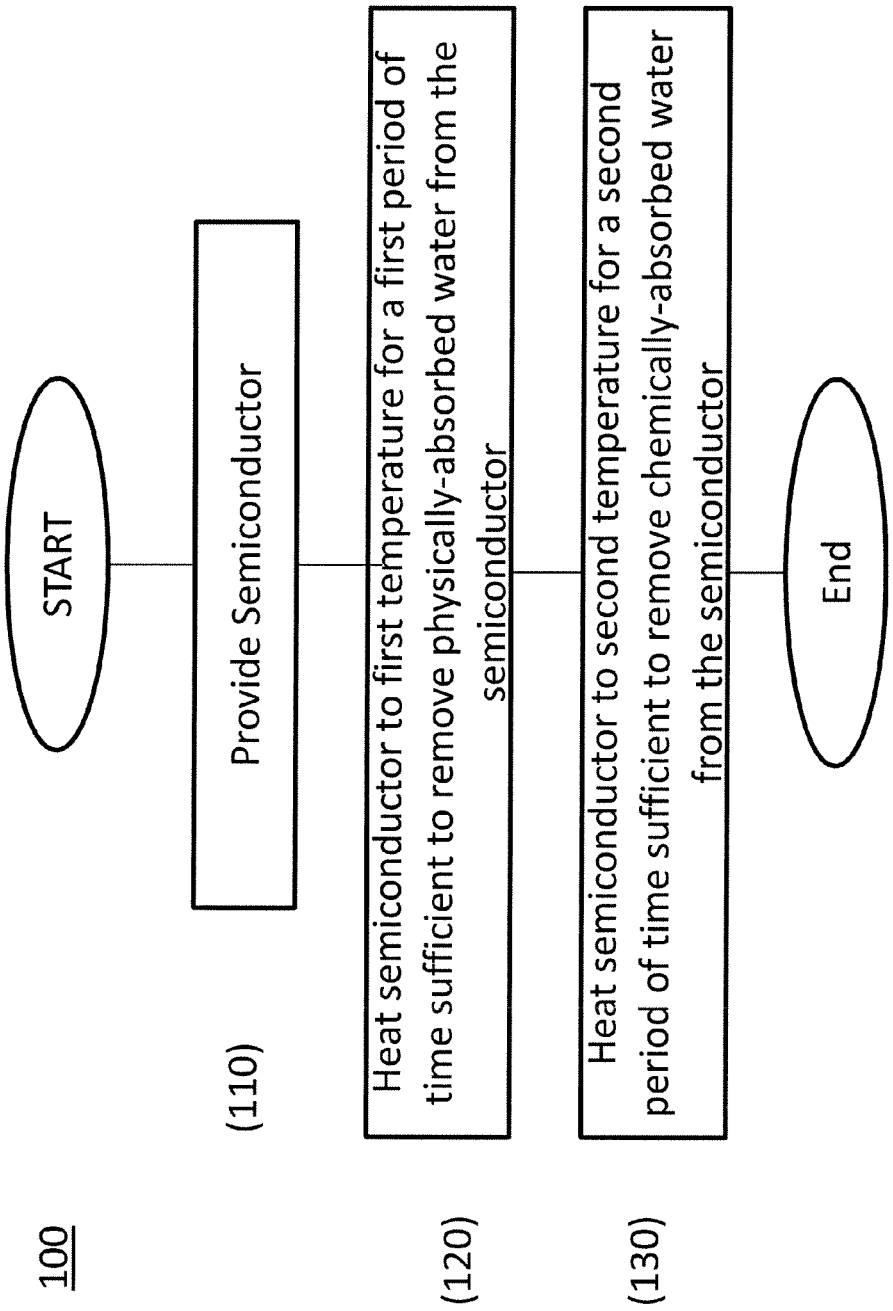
FIG. 1 shows an exemplary method (100) of the present invention.

Referring now to the drawings, and more particularly to FIG. 1, there are shown preferred embodiments of the method and structures according to the present invention, a preferred embodiment of which will now be described.

FIG. 1 illustrates an exemplary anneal method having a plurality of annealing steps which includes providing (110) the semiconductor, heating (120) the semiconductor to a first temperature for a first period of time sufficient to remove physically-adsorbed water from the semiconductor, and heating (130) the semiconductor to a second temperature, the second temperature being greater than the first temperature, for a period of time sufficient to remove chemically-adsorbed water from the semiconductor.

An exemplary embodiment of the method may include providing a semiconductor, conducting a low temperature anneal to remove physically adsorbed water from a semiconductor and subsequently a high temperature anneal to remove chemically bonded water from the semiconductor.

In an exemplary two-step anneal a semiconductor is first annealed at a temperature T, where 100° C.<T<200° C., for 24 hours in $N_2$-forming gas (FG) or clean $N_2$ followed by a 400° C. 1 hour anneal in $N_2$-forming gas or clean $N_2$ to restore the TDDB performance of partially-built BEOL stacks by driving out moisture so they can be tested for TDDB and so that the results will be representative of the intrinsic TDDB performance of the ILD and capping materials used.

In an exemplary embodiment the multiple step anneal is carried out in a nitrogen atmosphere containing hydrogen. A clean nitrogen atmosphere, nitrogen forming atmosphere, or a nitrogen and hydrogen mixture may help protect a portion the semiconductor (e.g., copper lines) from oxidizing during the annealing process.

In an exemplary embodiment the multiple step anneal may be carried out in another suitable inert gas.

While the above embodiment describes a particular temperature and time, the method is not limited thereto. The first anneal may be carried out for a time period in a range of 12 to 48 hours. Similarly, the second anneal may be performed at a temperature ranging from 350° C.-400° C. for 0.5 to 2 hours.

This method may provide the ability to test partial-build structures where no final passivation layers have to be used in the build. Therefore, the cost and turnaround time for conducting TDDB testing may be greatly reduced.

The above process can also be used to restore TDDB performance for fully-built, fully-passivated chips where an ingress path has been created through damage to the edge seal or final passivation of the chip.

The two step anneal works by first driving out the loosely-bound, physically-adsorbed water at 100° C.<T<200° C. either through imperfections in the BLOK cap (e.g., $Si_aC_b O_cH_dN_e$) for partially-built structures or through the damaged edge seal for fully-built chips with edge seal damage. The subsequent 400° C. anneal removes the remaining, more tightly-bound chemically-adsorbed water. Data has shown that a simple 400° C. one hour to five hour anneal or simple 350° C. one hour to six hour anneal alone will not completely restore TDDB performance. It is believed that this is due to the fact that the loosely bound physically-adsorbed water, if not first removed at a lower temperature 100° C.<T<200° C., reacts with the ILD and/or the cap/ILD interface and/or the TaN/Ta liner causing permanent damage at higher temperatures.

Figure 2:
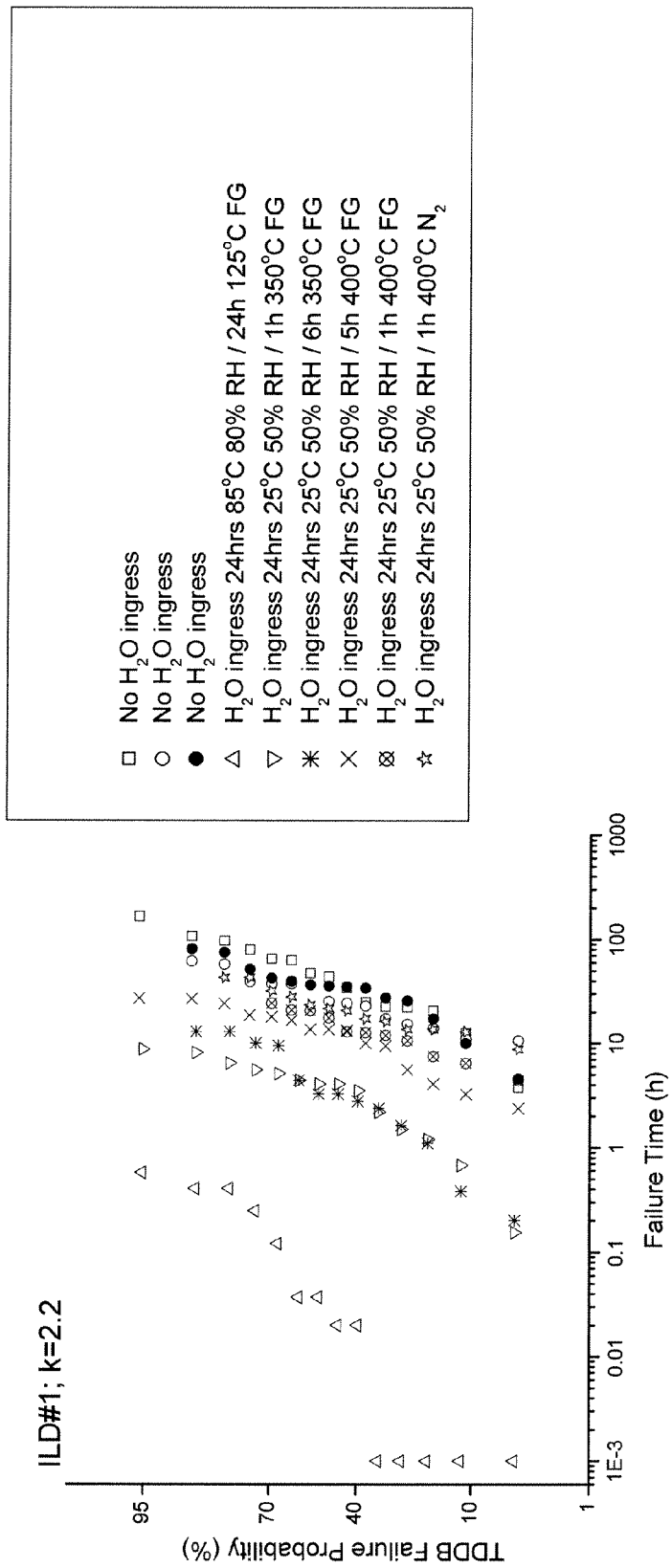
FIG. 2 shows a graph of experimental results comparing baseline TDDB tests with TDDB tests conducted after $H_2O$ ingress and one step anneals.

FIG. 2 provides a graph plotting TDDB failure probability vs. failure time for ILD#1 with a dielectric constant=2.2 which illustrates the results of experiments conducted by the inventors. All TDDB testing was carried out at 125° C. with an applied field of 3.0 to 3.5 MV/cm. In these experiments semiconductor structures with no $H_2O$ ingress and semiconductor structures with $H_2O$ ingress were subjected to various single step annealing processes. The TDDB test data, as shown in FIG. 2, shows that none of the single anneal procedures result in restoring a chip so that reliable TDDB testing may be conducted.

As can be seen in FIG. 2, there is a large drop in TDDB lifetime for fully passivated chips with an intentionally-damaged edge seal that have been exposed to $H_2O$ and subsequent single-temperature anneals at 125° C., 350° C., and 400° C. In FIG. 2, the open square, open circle, and solid circle represent as-received chips with no $H_2O$ ingress, the open triangle symbols represent chips with $H_2O$ ingress with just a low-temperature 125° C. anneal for 24 hours.

As can be seen in FIG. 2, the offset in TDDB lifetime versus a non-damaged chip is on the order of 2-3 orders of magnitude. A simple one-step anneal at 350° C. for one hour to six hours, as represented by the downward triangle and asterix symbols, results in some improvement in lifetime but there is still an offset on the order of 1-2 orders of magnitude compared to as-received data. A one-step anneal at 400° C. for one hour to five hours as represented by the x symbol, the circle-with-x symbol or the open star symbol, results in further improvement but there is still a significant offset of about 3× in lifetime when compared to the as-received data.

Figure 3:
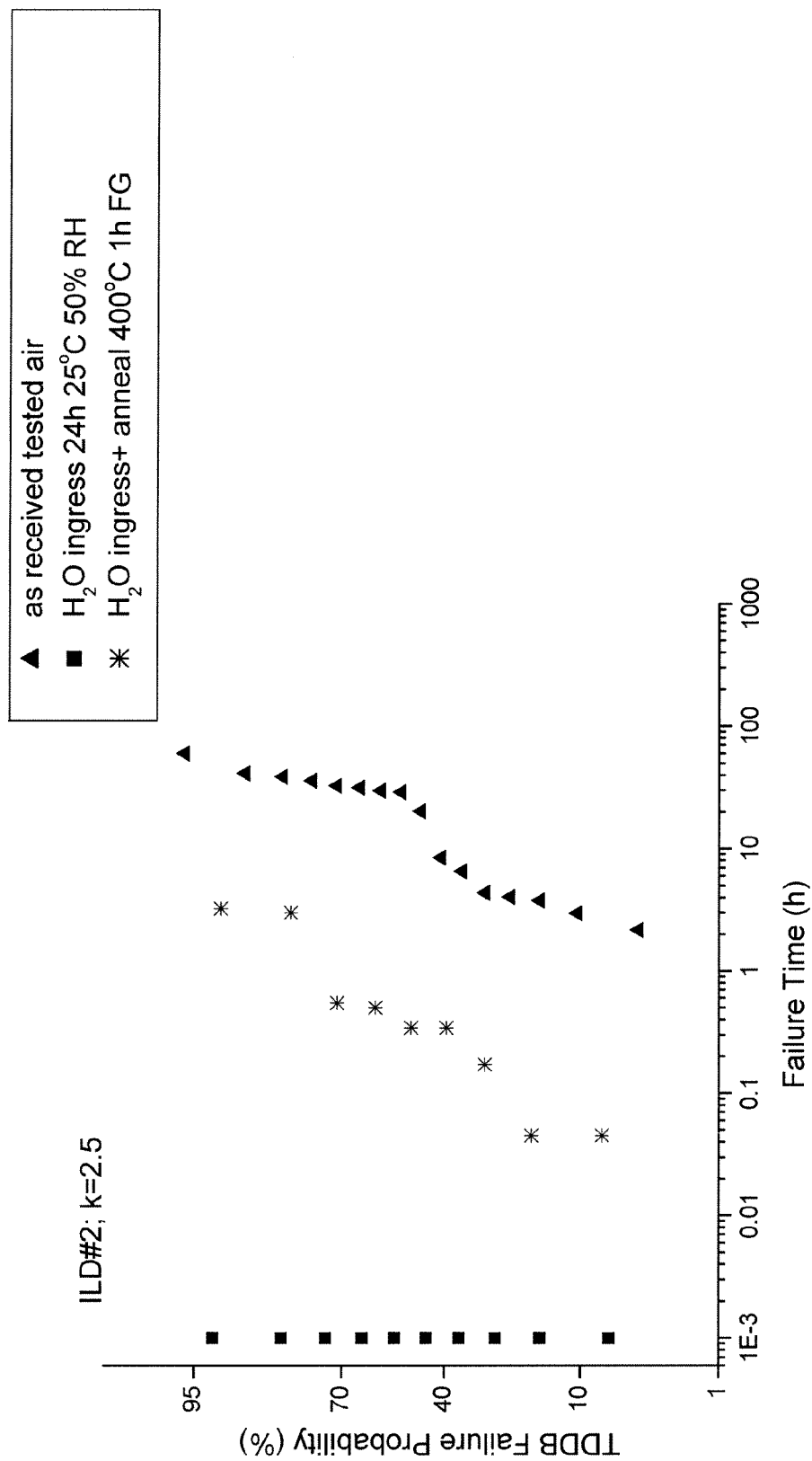
FIG. 3 shows a graph of experimental results comparing baseline TDDB tests with TDDB tests conducted after $H_2O$ ingress and a single step high temperature anneal.

FIG. 3 illustrates TDDB failure probability vs. failure time for ILD#2 with a dielectric constant=2.5. As shown in FIG. 3, a similar permanent offset in TDDB lifetime was observed for a simple one-step 400° C. anneal. The solid black triangles represent as received structures, fully-passivated, with no $H_2O$ ingress. Once again, to simulate $H_2O$ ingress into partial-build stacks, an intentional ingress path was created by damaging the edge seal. The solid black squares show that TDDB performance is severely degraded due to the addition of water with no annealing. After a 400° C. one hour anneal in FG the TDDB performance is nearly restored (fine black stars) but there still is an offset of about 1 order of magnitude in TDDB lifetime.

Figure 4:
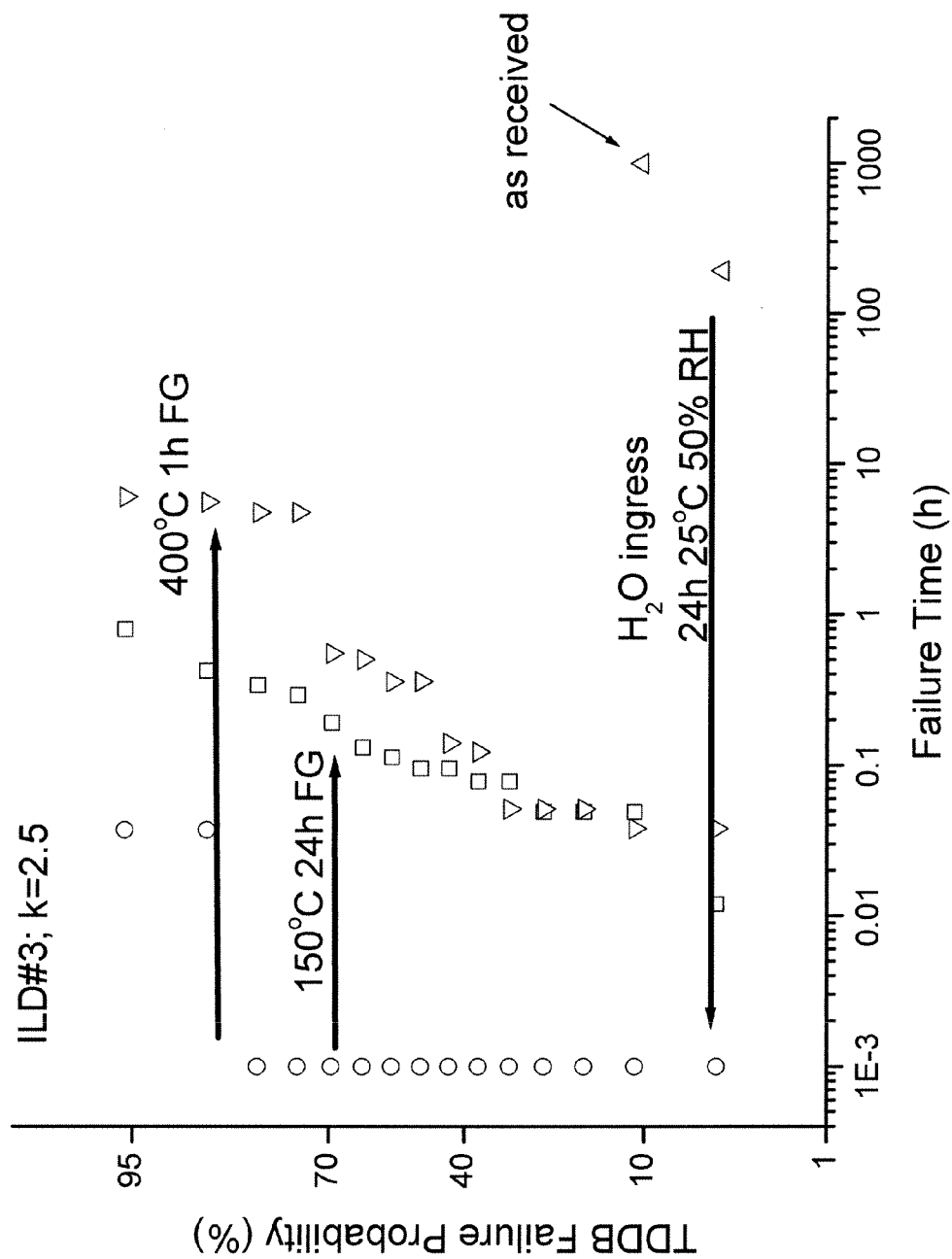
FIG. 4 shows a graph of experimental results comparing baseline TDDB tests with TDDB tests conducted after $H_2O$ ingress and a single step low temperature anneal or a single step high temperature anneal.

FIG. 4 illustrates TDDB failure probability vs. failure time for ILD#3 with a dielectric constant=2.5. The open, upward, black triangles represent as-received, fully-passivated chips with no $H_2O$ ingress. After $H_2O$ ingress the TDDB lifetime drops by 5 orders of magnitude essentially to the resolution limits of the test apparatus (open circle). After a single low temperature anneal at 125° C. for 24 hours some improvement in lifetime is seen although there is still an offset on the order of 3 orders of magnitude in lifetime (open square). After a one-step anneal at 400° C. for one hour (open, downward triangle) more improvement is observed than the single low temperature anneal but the offset is still essentially on the order of 3 orders of magnitude in lifetime when compared to the as-received data.

Figure 5:
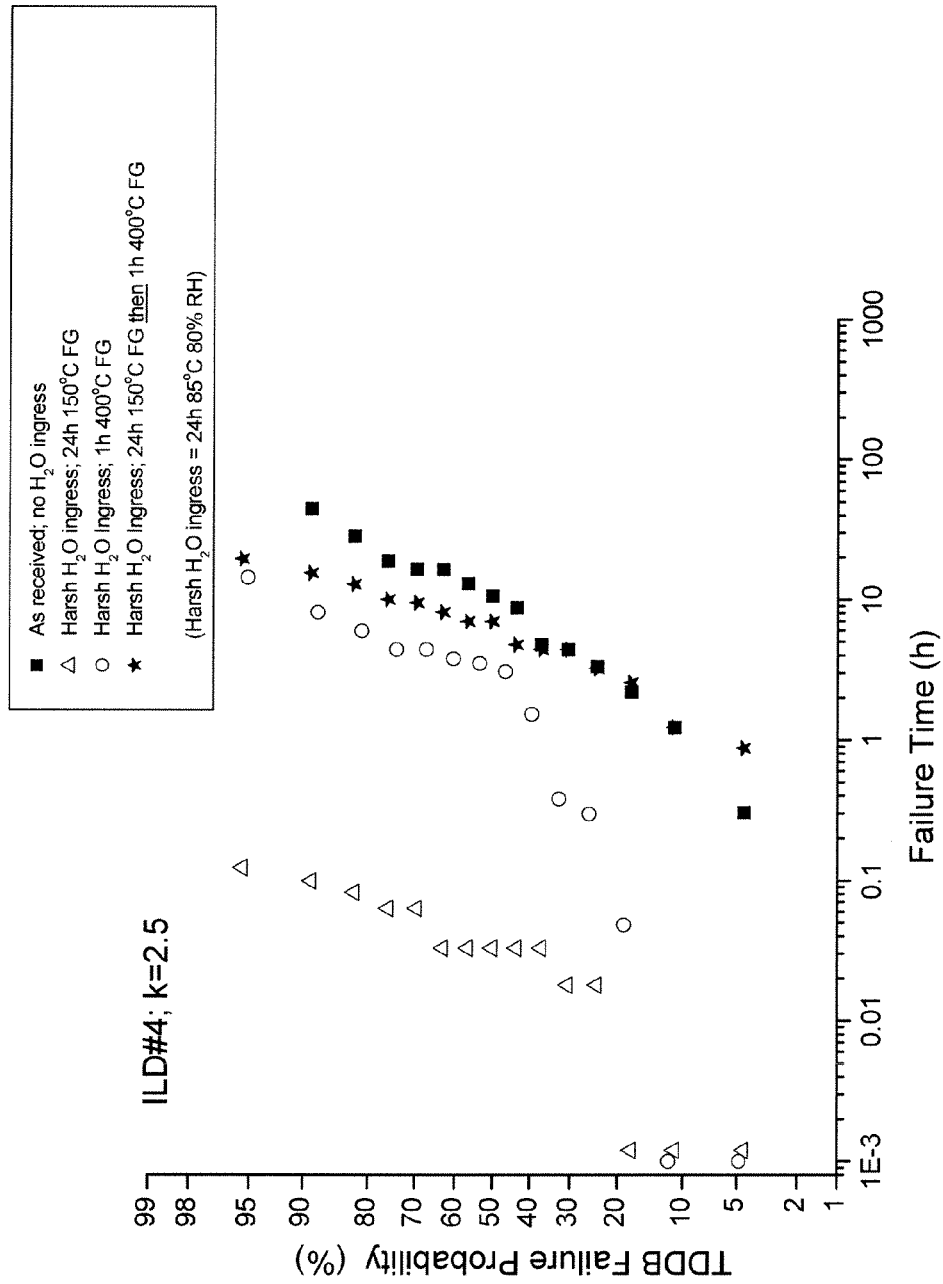
FIG. 5 shows a graph of experimental results comparing baseline TDDB tests with TDDB tests conducted after $H_2O$ ingress and using an exemplary two step anneal method.

FIG. 5 illustrates TDDB failure probability vs. failure time for ILD #4 with a dielectric constant=2.5. The TDDB data in this figure demonstrates that a two-step anneal, 150° C. for 24 hours followed by 400° C. for one hour, essentially completely restores TDDB performance to what was observed for as-received chips with no $H_2O$ ingress. The solid squares represent as-received chips with no $H_2O$ ingress. The triangles represent chips with damaged edge seal, exposed to $H_2O$ (particularly harsh; 24 hours 85° C. 80% relative humidity (RH)) and then annealed at 125° C. only for 24 hours. Note there is an offset of at least two orders of magnitude in lifetime. The open circles represent chips which had the harsh $H_2O$ exposure and only a simple anneal for one hour at 400° C. Although there is improvement in lifetime, there is still an order of magnitude offset in TDDB lifetime and a significant early fail population. The effect of the two-step anneal, after harsh $H_2O$ exposure, is represented by the solid stars. Note that with a two-step anneal, 150° C. for 24 hours and 400° C. for one hour, TDDB lifetime has essentially been restored to what was observed for as-received chips with no $H_2O$ ingress.

Figure 6:
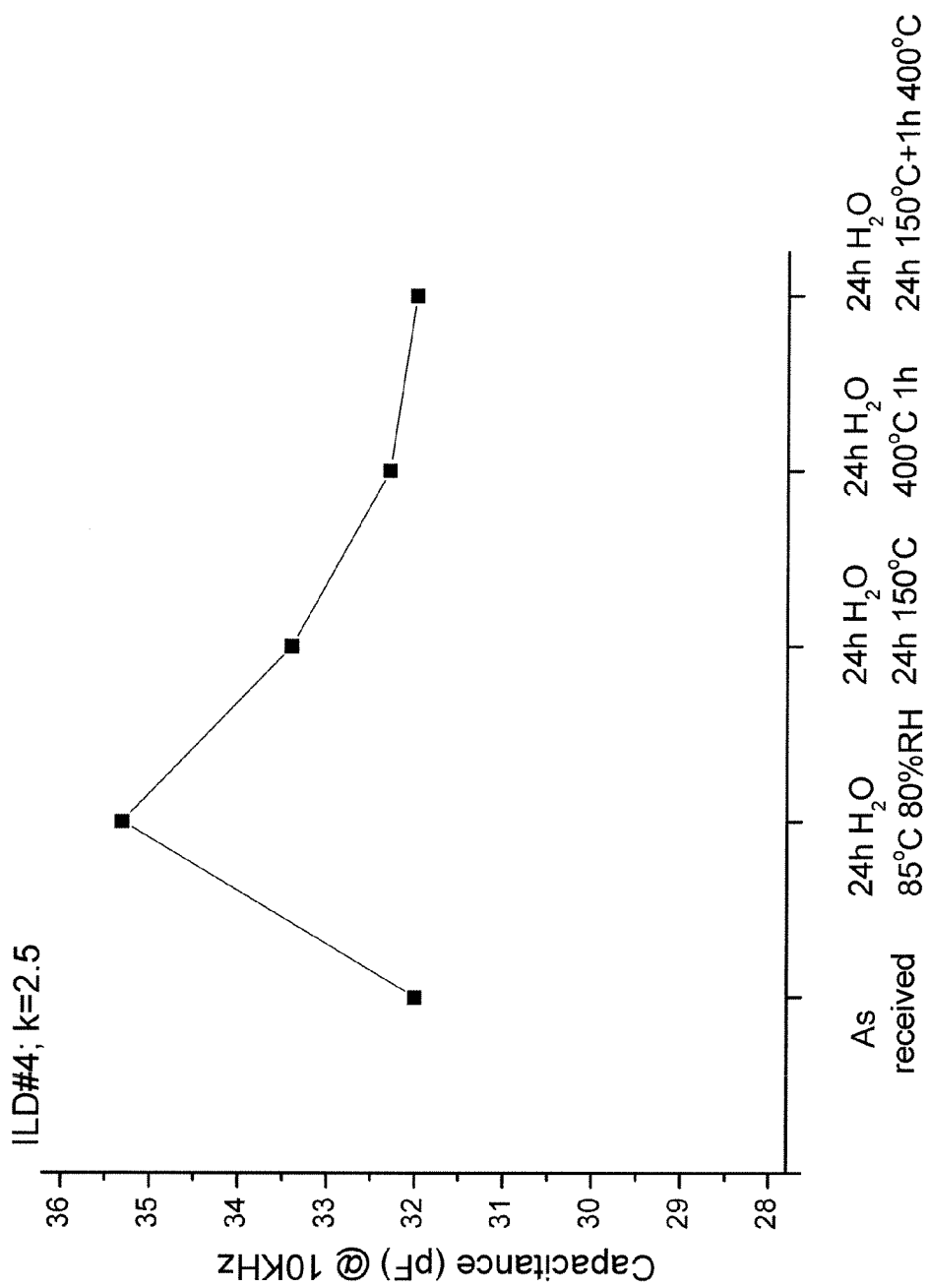
FIG. 6 shows a graph of experimental results of capacitance after annealing.

FIG. 6 illustrates capacitance in relation to annealing treatment. The experiments of FIG. 6 where conducted at room temperature, on ILD #4 with a dielectric constant=2.5 using a frequency of 10 kHz. FIG. 6 provides further evidence that the two-step anneal is effective in driving out $H_2O$, both physically and chemically adsorbed. As moisture is introduced into the TDDB structure (24 hours 85° C. 80% RH) the capacitance is observed to increase by approximately 10%. After annealing at 150° C. for 24 hours to remove the physically-adsorbed water the capacitance drops significantly but is still about 5% higher than the value measured for as-received chips. A simple 400° C. one hour anneal also restores the capacitance partially but the value is still higher than what was measured as-received. The two-step anneal completely restores capacitance to what was measured as-received suggesting moisture has effectively been removed from the structure.

Figure 7:
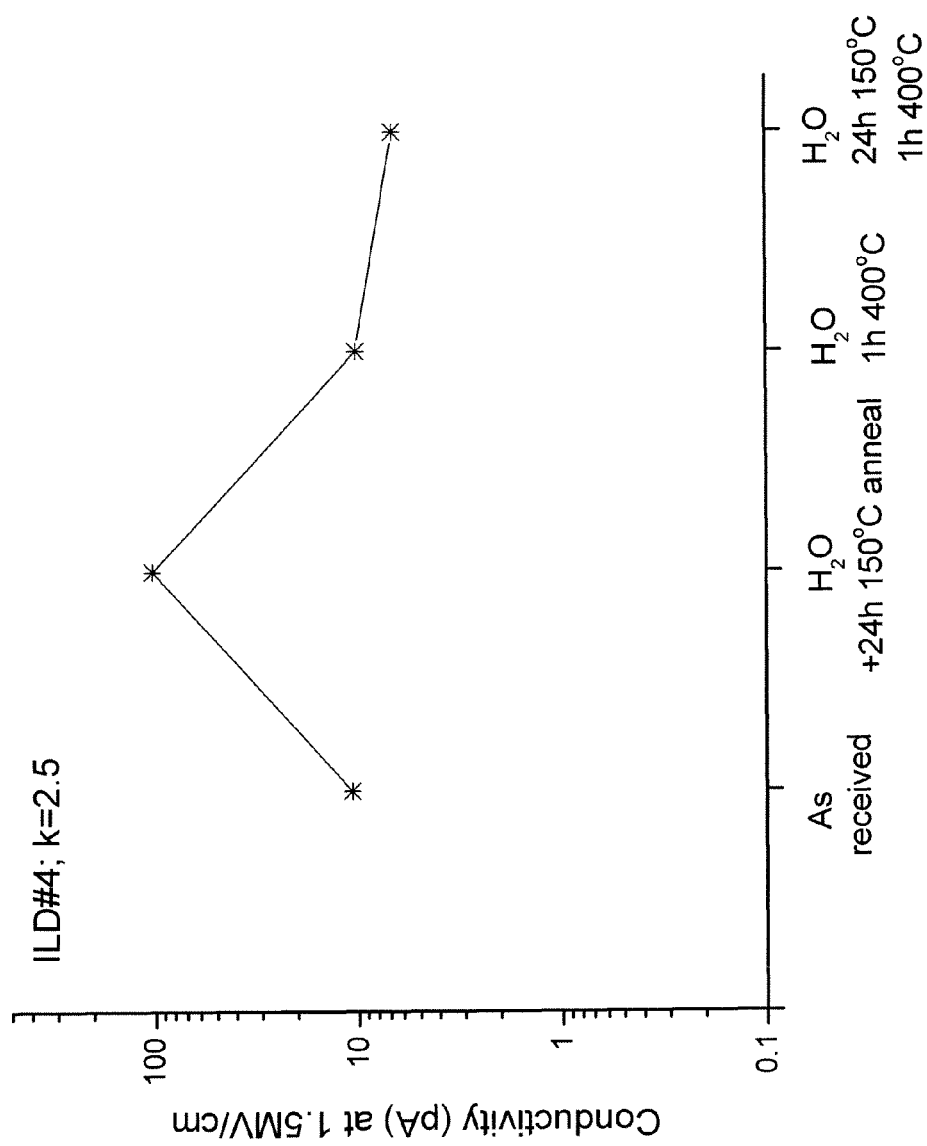
FIG. 7 shows a graph of experimental results of conductivity after annealing.

FIG. 7 illustrates conductivity in relation to annealing treatment. The experiments of FIG. 7 where conducted on ILD #4 with dielectric constant=2.5. Testing was done at 150° C. in an inert forming gas environment at 1.5 MV/cm. FIG. 7 displays further evidence that the two-step anneal is effective at removing moisture from the chips from conductivity data. Note that when moisture is introduced into the chip (24 hours 85° C. 80% RH) and a simple anneal is carried out at 150° C., the conductivity measured across a TDDB test structure increases dramatically by 10×. A simple anneal at 400° C. does not completely restore conductivity to its initial value. The two-step anneal completely restores conductivity to what was measured as-received.

In another exemplary aspect of the invention, the multiple step anneal process may be used to form a high density layer in an upper interface of the ILD. The high density layer may include an oxide layer formed in the upper interface of the ILD. The oxide layer may include $SiO_2$. The density of this layer may approach 2 grams/cm3, and in some cases can be up to 2.2 grams/cm3. The density of the ILD (labeled 2 in FIGS. 8 and 9) is lower, from 1 to 2 grams/cm3, with 1.5 grams/cm3 being a typical density.

This higher density layer on the upper interface of the ILD may improve TDDB reliability.

The exemplary method of the multiple step anneal may include providing a semiconductor, heating the semiconductor to a first temperature for a first period of time sufficient to remove physically-adsorbed water from the semiconductor, and heating the semiconductor to a second temperature, the second temperature being greater than the first temperature, for a period of time sufficient to remove chemically-adsorbed water from the semiconductor.

In an exemplary embodiment of the above method the may include conducting a (TDDB) test on the semiconductor. In this exemplary embodiment the TDDB test is preferable conducted after the heating the semiconductor to the second temperature.

In an exemplary embodiment of the above method the first temperature is lower than a temperature required to remove chemically-adsorbed water from the semiconductor.

In an exemplary embodiment of the above method the second temperature is a temperature sufficient to remove chemically-adsorbed water from the semiconductor.

In an exemplary embodiment of the above method the second temperature is a temperature equal to or greater than a temperature at which SiOH breaks down.

In an exemplary embodiment of the above method the second temperature is a temperature equal to or greater than a temperature at which SiOH breaks down into $H_2O$+Si—O—Si.

In an exemplary embodiment of the above method the semiconductor, prior to the heating the semiconductor to the first temperature, includes adsorbed water.

In an exemplary embodiment of the above method the semiconductor includes a plurality of metal conductors, and a dielectric including regions separating the plurality of metal conductors, the regions including an upper interface and a lower bulk region, the upper interface having a density greater than a density of the lower bulk region.

In an exemplary embodiment of the above method the density of the low k or ultra low k dielectrics may have a density of 1 $g/cm^3$ to 2 $g/cm^3$, for example 1.4 $g/cm^3$ or 1.5 $g/cm^3$, before the first and second anneal. After the above method, dielectric may include a dense oxide-like layer having a density of up to 2.2 $g/cm^3$. In an exemplary embodiment the density of a portion of the dielectric may increase by 47% to 57% after conducting the method.

In an exemplary embodiment, prior to heating the semiconductor to the first temperature, the dielectric includes an upper interface with water contamination.

In an exemplary embodiment of the above method the upper interface, prior to the heating the semiconductor to the first temperature, includes SiOH.

In an exemplary embodiment of the above method the upper interface, after to the heating the semiconductor to the second temperature, includes $SiO_2$.

An exemplary method of annealing a semiconductor includes providing the semiconductor, exposing the semiconductor to an atmosphere of $N_2$ at temperature greater than 100° C. and less than 200° C. for approximately 12-48 hours and exposing the semiconductor to an atmosphere of $N_2$ at temperature of in a range of 350° C. to 400° C. for approximately 0.5 to 2 hours.

Figure 8:
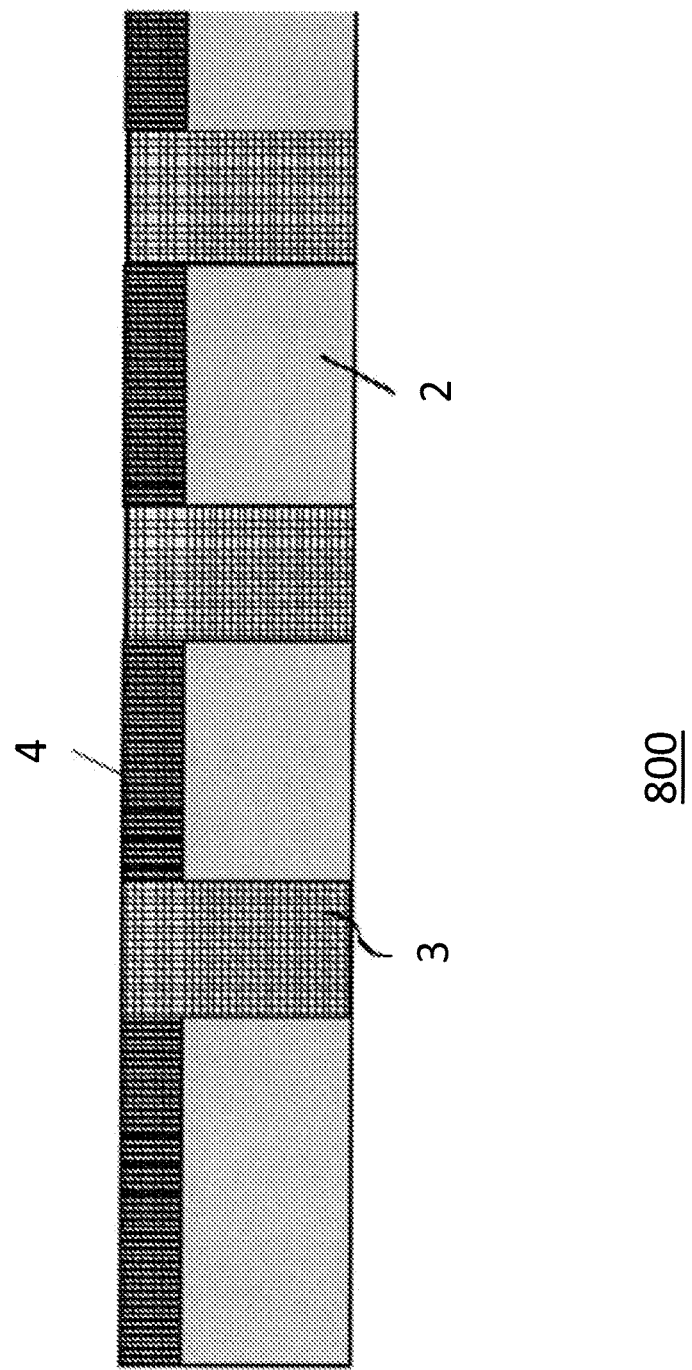
FIG. 8 shows a semiconductor before an exemplary method of the invention is conducted.

FIG. 8 illustrates an exemplary semiconductor 800 which includes an ILD 2 disposed between Cu lines 3. The top layer 4 of the ILD 2 includes SiOH. The SiOH layer may be formed by water intruding into semiconductor.

Figure 9:
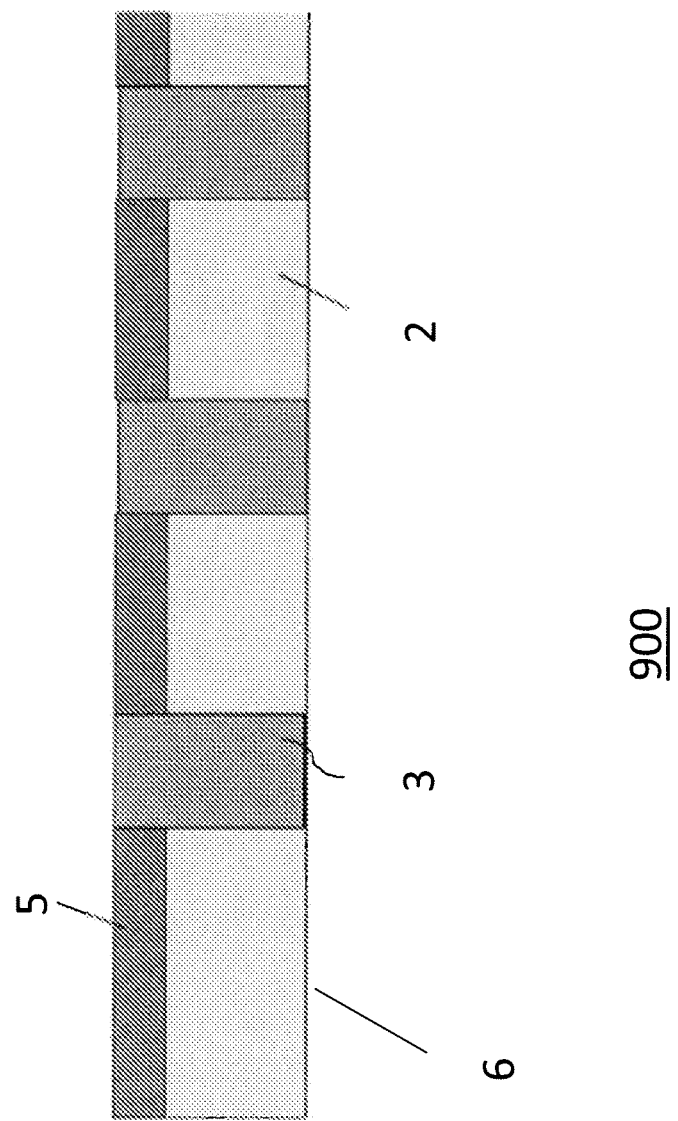
FIG. 9 shows a semiconductor after an exemplary method of the invention is conducted.

FIG. 9 illustrates the semiconductor 900 after the multiple step anneal process has been completed. After the multiple step anneal has been conducted, the ILD 2 includes an upper interface (i.e., outer layer) 5 having a higher density than a lower portion of the ILD 6.

FIG. 10 illustrates a semiconductor 1000 including a cap layer 7 which has pin-holes which can act as ingress points for moisture. Semiconductor 1000 also includes a Copper edge seal 9, which may be a feature of both partial-build structures and fully passivated structures, and a damaged portion 10 of the copper edge seal. It is noted that the edge seal may be formed of any suitable material. Further, it is noted that the cap layer may be formed of any suitable material such as $Si_aC_bO_cH_dN_e$. For example, the cap layer may be an alloy of Si, C, N and H, represented by $Si_aC_bH_dN_e$.

In an exemplary embodiment of the above semiconductor the low k or ultra low k dielectrics of ILD 6 may have a density of 1 g/cm³ to 2 g/cm³, for example 1.4 g/cm³ or 1.5 g/cm³, and the upper interface 5 may includes a dense oxide-like layer having a density of approximately 1.5 g/cm³ to 2.2 g/cm³. In an exemplary embodiment the density of upper interface 5 may be 47% to 57% greater than a density of ILD 6.

Advantageously, the higher density layer 5 is self aligned between the Cu lines 3.

In an exemplary embodiment the dense outer layer includes an oxide such as $SiO_2$ after the multiple step anneal.

An exemplary semiconductor interconnect wiring structure as described above may have an upper interface and lower bulk region of the dielectric which include $Si_aC_bO_cH_d$, where a, b, c and d represent the composition of the dielectric, and the a and c subscripts are greater in the composition of the upper interface and lesser in the lower bulk region. The exemplary dielectric may be formed such that the a, b, c and d subscripts are smoothly changing between the upper interface and the lower bulk region.

Another exemplary embodiment of the dielectric may include a lower bulk region of the dielectric which has a composition of $Si_aC_bO_cH_d$, and an upper interface which includes N and has a composition of $Si_aC_bO_cH_dN_e$.

In an exemplary embodiment the dielectric may have a dense oxide-like layer having a density of 1.5 g/cm³ to 2.2 g/cm³.

In an exemplary embodiment the semiconductor interconnect wiring structure is a back end of line (BEOL) interconnect wiring structure.

In an exemplary embodiment of the semiconductor interconnect wiring structure the dielectric is an inner-layer dielectric (ILD).

In an exemplary embodiment of the semiconductor a capping layer may be disposed on the dielectric.

In an exemplary embodiment the semiconductor has an upper interface which includes $SiO_2$.

In an exemplary embodiment the upper interface is disposed adjacent to the plurality of metal conductors. In this embodiment the upper interface may be disposed so as to not extend cover the tops of the plurality of metal conductors.

An exemplary embodiment of the invention may also include a TDDB test including the multiple step anneal conducted prior to conducting the TDDB testing.

While the invention has been described in terms of particular preferred embodiments, those skilled in the art will recognize that the invention can be practiced with modification within the spirit and scope of the appended claims.

Further, it is noted that, Applicants' intent is to encompass equivalents of all claim elements, even if amended later during prosecution.

The invention claimed is:

1. A method of annealing a semiconductor device including a dielectric layer having a lower bulk region and an upper interface region formed on the lower bulk region, the method comprising:
    providing the semiconductor device;
    heating the semiconductor device to a first temperature for a first period of time sufficient to remove substantially an entirety of physically-adsorbed water from the semiconductor device; and
    after the heating of the semiconductor device to the first temperature, heating the semiconductor device to a second temperature, the second temperature being greater than the first temperature, for a second period of time which is less than the first period of time and sufficient to remove chemically-adsorbed water from the semiconductor device, such that a density of the upper interface region is greater than a density of the lower bulk region, and an amount of silicon and oxygen in a composition of the upper interface region is greater than an amount of silicon and oxygen in a composition of the lower bulk region,
    wherein the first temperature comprises a temperature between 100° C. and 200° C. and the first period of time comprises a period of approximately 12 hours to 48 hours, and
    wherein the second temperature comprises a temperature in a range from 350° C. to 400° C. and the second period of time comprises a period of approximately 0.5 hours to 2 hours.

2. A method according to claim 1, wherein the first temperature is lower than a temperature required to remove the chemically-adsorbed water from the semiconductor device.

3. A method according to claim 1, wherein the second temperature is a temperature sufficient to remove the chemically-adsorbed water from the semiconductor device.

4. A method for testing a semiconductor device, the method comprising:
    annealing the semiconductor device according to claim 1; and
    performing a time dependent dielectric breakdown (TDDB) test on the semiconductor device.

5. A method according to claim 1, wherein the second temperature is a temperature equal to or greater than a temperature at which SiOH breaks down into $H_2O+Si\text{—}O\text{—}Si$.

6. A method according to claim 1, wherein the semiconductor device, prior to the heating the semiconductor device to the first temperature, comprises adsorbed water.

7. A method according to claim 1, wherein the semiconductor device includes:
    a plurality of metal conductors; and
    a dielectric including regions separating the plurality of metal conductors, the regions including an upper interface region and a lower bulk region, the upper interface region having a density greater than a density of the lower bulk region, and
    wherein, prior to heating the semiconductor device to the first temperature, the dielectric includes an upper interface region includes including SiOH.

8. A method according to claim 1, wherein the semiconductor device, prior to the heating the semiconductor device to the first temperature, comprises SiOH.

9. A method according to claim 1, wherein the semiconductor device, after to the heating the semiconductor device to the second temperature, comprises $SiO_2$.

10. A method of annealing a semiconductor device including a dielectric layer having a lower bulk region and an upper interface region formed on the lower bulk region, the method comprising:
    providing the semiconductor device;
    exposing the semiconductor device to an atmosphere comprising $N_2$ at a first temperature greater than 100° C. and less than 200° C. for approximately 12 to 48 hours; and
    after the exposing of the semiconductor device to an atmosphere comprising $N_2$ at the first temperature, exposing the semiconductor device to an atmosphere comprising $N_2$ at a second temperature in a range of 350° C. to 400° C. for approximately 0.5 to 2 hours, such that a density of the upper interface region is greater than a density of the lower bulk region, and an amount of silicon and oxygen in a composition of the upper interface region is greater than an amount of silicon and oxygen in a composition of the lower bulk region.

11. A method according to claim 10, wherein the semiconductor device comprises a back end of line (BEOL) interconnect wiring structure.

12. A semiconductor device, comprising:
a plurality of metal conductors; and
a dielectric including regions separating the plurality of metal conductors, the regions including an upper interface region and a lower bulk region, the upper interface region having a density 47% to 57% greater than a density of the lower bulk region, and an amount of silicon and oxygen in a composition of the upper interface region being greater than an amount of silicon and oxygen in a composition of the lower bulk region.

13. The semiconductor device of claim 12, wherein the upper interface region and the lower bulk region of the dielectric comprise $Si_aC_bO_cH_d$, and
wherein a, b, c and d represent a composition of the dielectric, and a and c are greater in the composition of the upper interface region and lesser in the lower bulk region.

14. The semiconductor device of claim 13, wherein the dielectric comprises a material such that a, b, c and d are smoothly changing between the upper interface region and the lower bulk region.

15. The semiconductor device of claim 13, wherein the lower bulk region of the dielectric comprises a composition $Si_aC_bO_cH_d$, and
wherein the upper interface region includes N and comprises a composition of $Si_aC_bO_cH_dN_e$.

16. The semiconductor device of claim 12, wherein the semiconductor device comprises a back end of line (BEOL) interconnect wiring structure.

17. The semiconductor device of claim 12, wherein the dielectric comprises an inner-layer dielectric (ILD).

18. The semiconductor device of claim 12, further comprising a capping layer disposed on the dielectric.

19. The semiconductor device of claim 12, wherein the upper interface region comprises $SiO_2$.

20. The semiconductor device of claim 12, wherein the upper interface region is disposed adjacent to the plurality of metal conductors.

21. The method according to claim 1, wherein the first temperature comprises a temperature between 100° C. and 200° C. and the first period of time comprises a period of approximately 12 hours to 48 hours,
wherein the second temperature comprises a temperature in a range from 350° C. to 400° C. and the second period of time comprises a period of approximately 0.5 hours to 2 hours,
wherein the density of the upper interface region is 47% to 57% greater than a density of the lower bulk region, and
wherein after the heating of the semiconductor device to the second temperature, the composition of the lower bulk region comprises $Si_aC_bO_cH_d$, and the composition of the upper interface region comprises $Si_aC_bO_cH_dN_e$.

* * * * *